United States Patent
Ferguson

(10) Patent No.: US 8,063,516 B2
(45) Date of Patent: Nov. 22, 2011

(54) FOUR QUADRANT MOSFET BASED SWITCH

(75) Inventor: Bruce Ferguson, Anaheim, CA (US)

(73) Assignee: Microsemi Corporation, Garden Grove, CA (US)

( * ) Notice: Subject to any disclaimer, the term of this patent is extended or adjusted under 35 U.S.C. 154(b) by 220 days.

(21) Appl. No.: 12/652,045

(22) Filed: Jan. 5, 2010

(65) Prior Publication Data

US 2010/0176657 A1   Jul. 15, 2010

Related U.S. Application Data

(60) Provisional application No. 61/145,040, filed on Jan. 15, 2009.

(51) Int. Cl.
*H02J 4/00* (2006.01)

(52) U.S. Cl. .................. 307/130; 307/125; 307/115

(58) Field of Classification Search .................. 307/125, 307/130, 115

See application file for complete search history.

(56) References Cited

U.S. PATENT DOCUMENTS

| | | | |
|---|---|---|---|
| 5,400,239 A | 3/1995 | Caine | |
| 5,510,641 A | 4/1996 | Yee et al. | |
| 5,550,701 A | 8/1996 | Nadd et al. | |
| 5,682,050 A * | 10/1997 | Williams | 257/368 |
| 5,689,144 A * | 11/1997 | Williams | 307/130 |
| 5,689,209 A | 11/1997 | Williams et al. | |
| 5,883,495 A | 3/1999 | Smith et al. | |
| 5,892,347 A | 4/1999 | Zweighaft et al. | |
| 5,994,882 A | 11/1999 | Ma | |
| 6,107,844 A | 8/2000 | Berg et al. | |
| 6,246,214 B1 | 6/2001 | Oglesbee | |
| 6,396,250 B1 | 5/2002 | Bridge | |
| 6,459,606 B1 | 10/2002 | Jadric | |
| 6,462,962 B1 | 10/2002 | Cuk | |
| 6,535,400 B2 | 3/2003 | Bridge | |
| 6,580,255 B1 | 6/2003 | Wittenbreder, Jr. | |
| 6,618,274 B2 | 9/2003 | Boylan et al. | |
| 6,711,038 B2 | 3/2004 | Ziegler et al. | |
| 7,969,203 B1 * | 6/2011 | Wu et al. | 327/94 |
| 2002/0030533 A1 * | 3/2002 | De et al. | 327/534 |
| 2003/0128556 A1 | 7/2003 | Zhange | |
| 2005/0083625 A1 | 4/2005 | Thiery | |
| 2006/0192606 A1 * | 8/2006 | Pan | 327/534 |

* cited by examiner

*Primary Examiner* — Fritz M Fleming
(74) *Attorney, Agent, or Firm* — Simon Kahn

(57) ABSTRACT

An electronically controlled four quadrant MOSFET based switch in which a pair of drivers are provided in cooperation with a MOSFET. A first one of the drivers is arranged such that when current flow through the MOSFET is to be enabled responsive to a first condition of the control signal, the gate of the MOSFET is driven with an appropriate voltage, and when current flow through the MOSFET is to be disabled responsive to a second condition of the control signal, the gate is driven towards a limit voltage. A second one of the drivers is arranged such that when current flow through the MOSFET is to be enabled the body diode connection of the MOSFET is driven towards the potential of the MOSFET source, and when current flow through the MOSFET is to be disabled the body diode connection is driven towards the limit voltage.

17 Claims, 4 Drawing Sheets

FOUR QUADRANT MOSFET BASED SWITCH

CROSS-REFERENCE TO RELATED APPLICATIONS

This application claims priority from U.S. Provisional Patent Application Ser. No. 61/145,040 filed Jan. 15, 2009, entitled "Four Quadrant MOSFET Based Switch", the entire contents of which is incorporated herein by reference.

TECHNICAL FIELD

The present invention relates to the field of electronically controlled switches, and more particularly to a MOSFET based electronically controlled switch arranged to block current in both directions when open.

BACKGROUND OF THE INVENTION

A metal oxide semiconductor field effect transistor (MOSFET) is essentially a four terminal device: gate, drain, source and body. In almost all conventional MOSFETs the body is permanently internally attached to the source, and only three terminals are brought out for connection to other circuit elements. An N-Channel MOSFET, often written NMOSFET, will not block positive current flow from the source to the drain, irrespective of the gate voltage, if the drain to source voltage, denoted $V_{DS}$, is $<-0.7V$ due to the body diode inherent in the NMOSFET. Similarly, a P-Channel MOSFET, often written PMOSFET, will not block positive current flow from the drain to the source, irrespective of gate voltage, if $V_{DS}$ is $>+0.7V$ due to the body diode inherent in the PMOSFET. It is possible to implement back-to-back MOSFETs, in which the drain of a first MOSFET is connected to the source of a second MOSFET of a similar channel so as to block this body diode sourced current flow, but the penalty is that the back-to-back MOSFETs have twice the channel resistance of a single MOSFET.

As described above, for an NMOSFET, if the drain is at a lower potential than the body by a diode drop, current will flow through the body to the drain, which from the outside world appears as current flow from source-to-drain. Similarly, for a PMOSFET, if the drain is at a higher potential than the body by a diode drop, current will flow through from the drain to the body, which from the outside world appears as current flow from drain to source. There is no inherent requirement that the body of the MOSFET be attached to the source, but to prevent body diode conduction, it is necessary that the body be held at an appropriate potential in relation to either side of the MOSFET channel.

Many circuits, particularly synchronous secondary side regulation schemes, would benefit from a MOSFET that when turned off would block current flow from both drain to source and from source to drain, over a wide range of potentials.

SUMMARY

Accordingly, it is a principal object of the present embodiments to overcome at least some of the disadvantages of prior art. This is provided in certain embodiments by an arrangement in which a pair of drivers are provided in cooperation with a MOSFET, and a limit voltage source is provided, the limit voltage source arranged to provide a voltage consonant with the most extreme voltage experienced by the drain of the MOSFET when the drain is reverse biased in relation to the source.

Each of the pair of drivers is coupled to a control signal. A first one of the drivers is arranged such that when current flow through the MOSFET is to be enabled responsive to a first condition of the control signal, the gate of the MOSFET is driven with an appropriate voltage, and when current flow through the MOSFET is to be disabled responsive to a second condition of the control signal, the gate is driven towards the limit voltage. A second one of the drivers is arranged such that when current flow through the MOSFET is to be enabled responsive to the first condition of the control signal, the body diode connection of the MOSFET is driven towards the potential of the MOSFET source, and when current flow through the MOSFET is to be disabled responsive to the second condition of the control signal, the body diode connection is driven towards the limit voltage.

Advantageously, the four quadrant MOSFET based switch is in one embodiment combined with a multiple output DC/DC converter whose design is simplified due to the reverse blocking feature. The multiple output DC/DC converter is in one further embodiment a flyback converter, and in another further embodiment a secondary side regulated forward converter.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Figure 1:
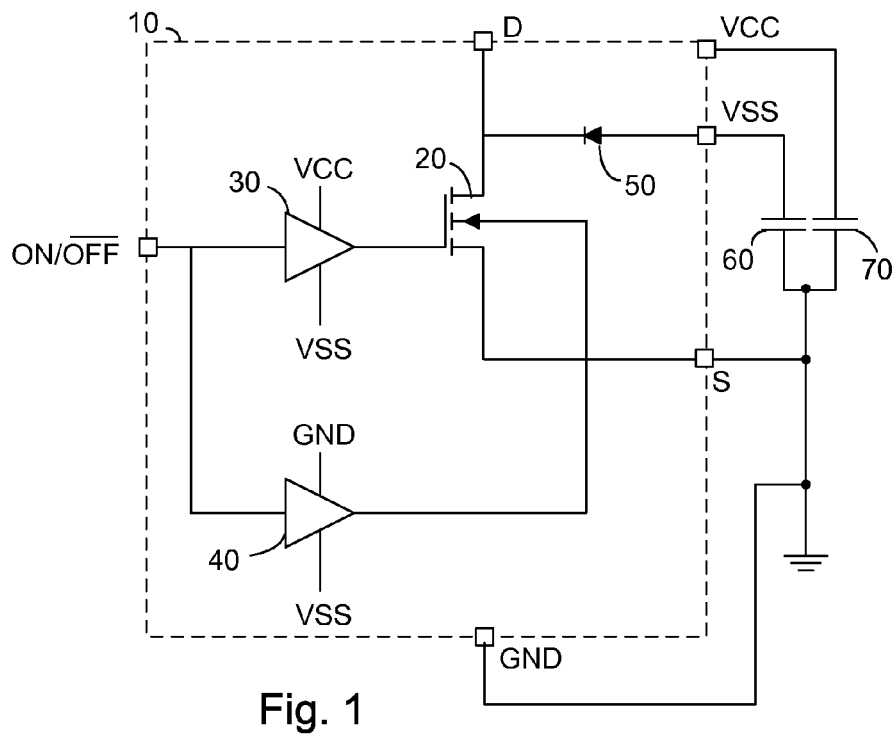
FIG. 1 illustrates a high level schematic diagram of an integrated four quadrant NMOSFET based switch with a limit voltage source constituted of a storage capacitor in cooperation with a unidirectional electronic valve.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level schematic diagram of an integrated four quadrant NMOSFET based switch 10 with an associated limit voltage source constituted of a capacitor 60 and a capacitor 70. Integrated four quadrant NMOSFET based switch 10 comprises an NMOSFET 20, a pair of drivers 30 and 40, and a unidirectional electronic valve 50. Integrated four quadrant NMOSFET based switch 10 further comprises a plurality of terminals denoted respectively VCC, VSS, GND, D, S and ON/$\overline{\text{OFF}}$. Terminals D and S represent the drain and source, respectively, of integrated four quadrant NMOSFET based switch 10, and terminal ON/$\overline{\text{OFF}}$ represents the control terminal thereof. Terminal VCC represents the positive supply rail of integrated four quadrant NMOSFET based switch 10, terminal VSS represents the negative supply rail of integrated four quadrant NMOSFET based switch 10, and terminal GND represents the common potential point of integrated four quadrant NMOSFET based switch 10.

A first end of storage capacitor 60 is connected to terminal VSS and a first end of capacitor 70 is connected to terminal VCC. A second end of capacitor 60 is connected to a second end of capacitor 70 and to a common point, in one embodiment the common point being ground. The input of each of drivers 30 and 40 is connected to terminal ON/$\overline{\text{OFF}}$. The positive supply rail terminal of driver 30 is connected to terminal VCC and the negative supply rail terminal of driver 30 is connected to terminal VSS. The output of driver 30 is connected to the gate of NMOSFET 20. The positive supply rail terminal of driver 40 is connected to terminal GND and the negative supply rail terminal of driver 40 is connected to terminal VSS. The output of driver 40 is connected to the body terminal of NMOSFET 20. The source of NMOSFET 20 is connected to terminal S, and the drain of NMOSFET 20 is connected to terminal D. Terminal S and terminal GND are both connected to a common point, in one embodiment the common point being ground. The anode of unidirectional electronic valve 50 is connected to terminal VSS and the cathode of unidirectional electronic valve 50 is connected to the drain of NMOSFET 20.

In operation, the combination of unidirectional electronic valve 50 and capacitor 60 functions to ensure that terminal VSS is kept within a diode drop of the most negative voltage appearing over time at terminal D. Capacitor 70 functions to filter any high frequency ripple found on voltage rail VCC, which as indicated above represents the positive supply rail for integrated four quadrant NMOSFET based switch 10.

A control signal is received at terminal ON/$\overline{\text{OFF}}$. If the control signal is at a first condition, e.g. of a positive value, indicative of the desire to turn on NMOSFET 20, the output of driver 30, and as a result the gate of NMOSFET 20, is driven towards the positive supply rail of driver 30, specifically the voltage appearing at terminal VCC, thereby turning on NMOSFET 20 and allowing current to flow there through. The output of driver 40, and as a result the body terminal of NMOSFET 20, is similarly driven towards the positive supply rail of driver 40, specifically the potential of common terminal GND. Thus the body terminal of NMOSFET 20 is at the same potential as the source of NMOSFET 20, which is preferable so as to ensure optimal current flow through NMOSFET 20 with minimum channel resistance. If the control signal is at a second condition, e.g. of a negative value, indicative of the desire to turn off NMOSFET 20, the output of driver 30, and as a result the gate of NMOSFET 20, is driven towards the negative supply rail of driver 30, specifically the voltage appearing at terminal VSS, thereby turning off NMOSFET 20 and blocking current flow there through. The output of driver 40, and as a result the body terminal connection of NMOSFET 20, is similarly driven towards the negative supply rail of driver 40, specifically the voltage appearing at terminal VSS, and is disconnected from the source terminal of NMOSFET 20, and from terminal S. The channel from the source to the drain of NMOSFET 20 is pinched off by the application of the same voltage to the body and gate of NMOSFET 20. The body is held to a potential that is less than or equal to either the S or D terminal so conduction can not occur from the body contact to the S or D terminal.

Figure 2:
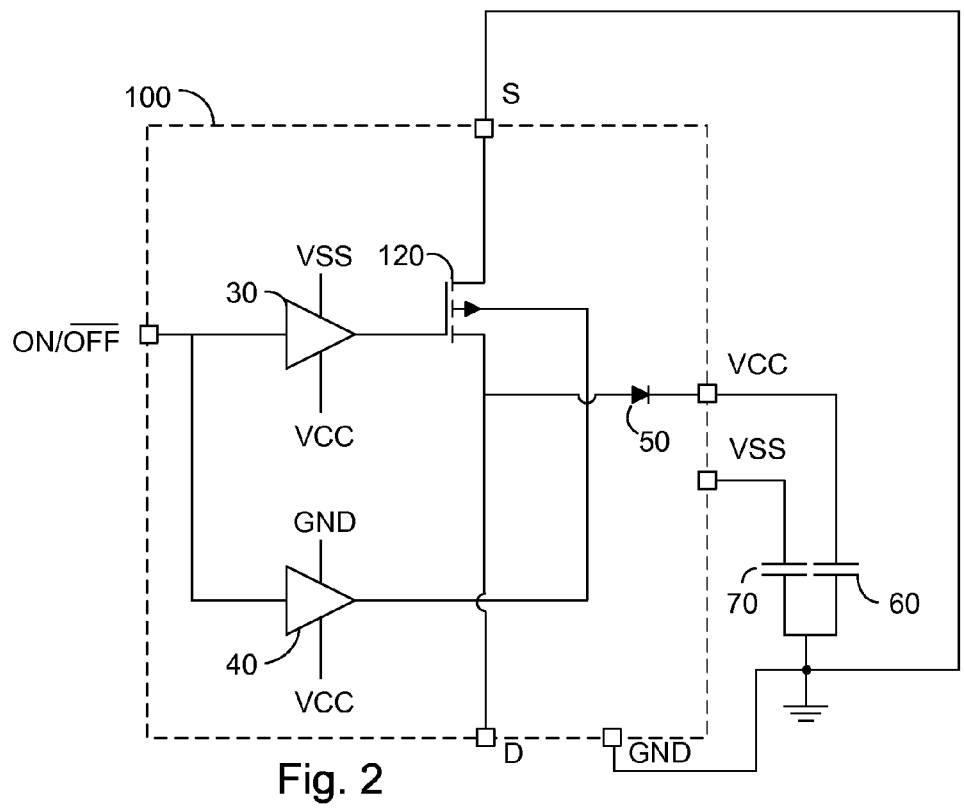
FIG. 2 illustrates a high level schematic diagram of an integrated four quadrant PMOSFET based switch with a limit voltage source constituted of a storage capacitor in cooperation with a unidirectional electronic valve.

FIG. 2 illustrates a high level schematic diagram of an integrated four quadrant PMOSFET based switch 100 with an associated limit voltage source constituted of a capacitor 60 and a capacitor 70. Integrated four quadrant PMOSFET based switch 100 comprises a PMOSFET 120, a pair of drivers 30 and 40, and a unidirectional electronic valve 50. Integrated four quadrant PMOSFET based switch 100 further comprises a plurality of terminals denoted respectively VCC, VSS, GND, D, S and ON/$\overline{\text{OFF}}$. Terminals D and S represent the drain and source, respectively, of integrated four quadrant PMOSFET based switch 100, and terminal ON/$\overline{\text{OFF}}$ represents the control terminal thereof. Terminal VCC represents the positive supply rail of integrated four quadrant PMOSFET based switch 100, terminal VSS represents the negative supply rail of integrated four quadrant PMOSFET based switch 100, and terminal GND represents the common potential point of integrated four quadrant PMOSFET based switch 100.

A first end of capacitor 60 is connected to terminal VCC and a first end of capacitor 70 is connected to terminal VSS. A second end of capacitor 60 is connected to a second end of capacitor 70 and to a common point, in one embodiment the common point being ground. The input of each of drivers 30 and 40 is connected to terminal ON/$\overline{\text{OFF}}$. The positive supply rail terminal of driver 30 is connected to terminal VSS and the negative supply rail terminal of driver 30 is connected to terminal VCC. The output of driver 30 is connected to the gate of PMOSFET 120. The positive supply rail terminal of driver 40 is connected to terminal GND and the negative supply rail of driver 40 is connected to terminal VCC. The output of driver 40 is connected to the body terminal of PMOSFET 120. The source of PMOSFET 120 is connected to terminal S, and the drain of PMOSFET 120 is connected to terminal D. Terminal S and terminal GND are both connected to a common point, in one embodiment the common point being ground. The cathode of unidirectional electronic valve 50 is connected to terminal VCC and the anode of unidirectional electronic valve 50 is connected to the drain of PMOSFET 120.

In operation, the combination of unidirectional electronic valve 50 and capacitor 60 functions to ensure that terminal VCC is kept within a diode drop of the most positive voltage appearing over time at terminal D. Capacitor 70 functions to filter any high frequency ripple found on voltage rail VSS, which as indicated above represents the negative supply rail for integrated four quadrant PMOSFET based switch 100.

A control signal is received at terminal ON/OFF. If the control signal is at a first condition, e.g. of a positive value, indicative of the desire to turn on PMOSFET 120, the output of driver 30, and as a result the gate of PMOSFET 120, is driven towards the positive supply rail of driver 30, specifically the voltage appearing at terminal VSS, thereby turning on PMOSFET 120 and allowing current to flow there through. The output of driver 40, and as a result the body terminal of PMOSFET 120, is similarly driven towards the positive supply rail of driver 40, specifically the potential of common terminal GND. Thus the body terminal of PMOSFET 20 is at the same potential as the source of PMOSFET 120, which is preferable so as to ensure optimal current flow through PMOSFET 120 with minimal channel resistance. If the control signal is at a second condition, e.g. of a negative value, indicative of the desire to turn off PMOSFET 120, the output of driver 30, and as a result the gate of PMOSFET 120, is driven towards the negative supply rail of driver 30, specifically the voltage appearing at terminal VCC, thereby turning off PMOSFET 120 and blocking current flow there through. The output of driver 40, and as a result the body terminal connection of PMOSFET 120, is similarly driven towards the negative supply rail of driver 40, specifically the voltage appearing at terminal VCC, and is disconnected form the source terminal of PMOSFET 120 and from terminal S. The channel from the source to the drain of PMOSFET 120 is pinched off by the application of the same voltage to the body and gate of enhancement mode PMOSFET 120. The body is held to a potential that is greater than or equal to either the S or D terminal so conduction can not occur from the body contact to the S or D terminal.

Figure 3A:
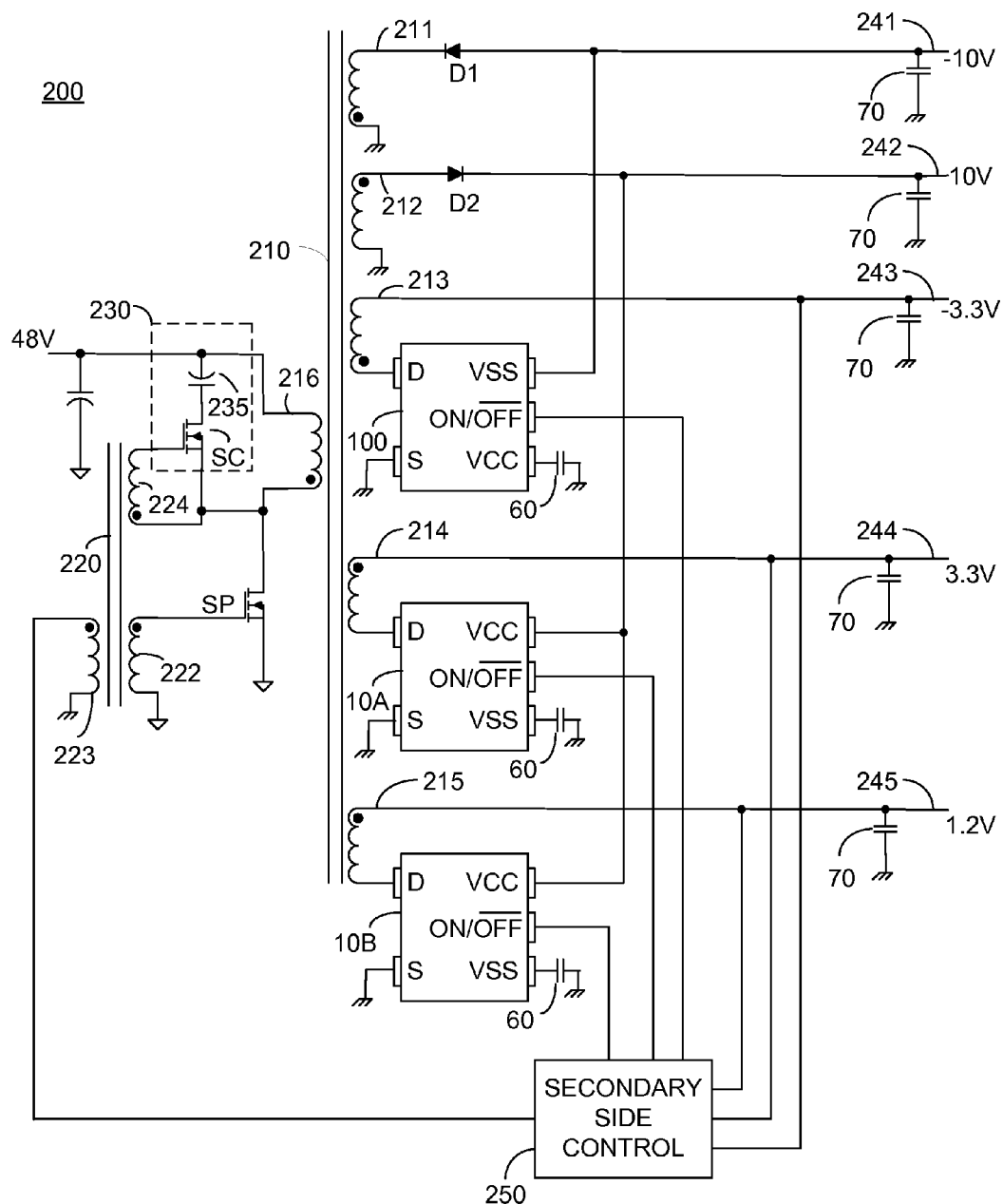
FIG. 3A illustrates a high level schematic diagram of an embodiment of a flyback converter implemented with embodiments of the integrated four quadrant MOSFET based switches of FIGS. 1 and 2.

FIG. 3A illustrates a high level schematic diagram of an embodiment of a flyback converter 200 implemented with embodiments of integrated four quadrant MOSFET based switches 10 and 100 of FIGS. 1 and 2. Flyback converter 200 comprises: a first and a second integrated four quadrant NMOSFET based switch 10, labeled respectively integrated four quadrant NSMOSFET based switch 10A and 10B, and collectively denoted integrated four quadrant NMOSFET based switch 10, each with an associated capacitor 60, and an integrated four quadrant PMOSFET based switch 100, with an associated capacitor 60, each integrated four quadrant MOSFET based switch exhibiting the terminals described above in relation to FIGS. 1 and 2; a transformer 210 exhibiting a plurality of secondary windings 211, 212, 213, 214 and 215 magnetically coupled to a primary winding 216; a plurality of capacitors 70, each associated with a particular output lead denoted 241, 242, 243, 244 and 245, respectively; a pair of unidirectional electronic valves D1 and D2; a gate drive isolation transformer 220 exhibiting a pair of secondary windings 222 and 224 magnetically coupled to a primary winding 223; an active clamp 230 comprising a capacitor 235 and an electronically controlled switch SC; a primary electronically controlled switch SP; and a secondary side controller 250. The active clamp provides a path to discharge the primary leakage inductance and preferably further serves as a ballast for excess transformer energy; this prevents voltage spikes from occurring on the secondary windings and also allows flyback converter 200 to continue switching at the normal duty cycle even in the absence of a load on output leads 243, 244 and 245. Preferably switching at the normal duty cycle further keeps alive the power source used for secondary side controller 250, which in one embodiment is output lead 242.

A first end of capacitor 235 is connected to a first end of primary winding 216 of transformer 210 and a power source, illustrated without limitation as +48V DC provided across an input capacitor. A second end of capacitor 235 is connected to the drain of electronically controlled switch SC. The gate of electronically controlled switch SC is connected to a first end of secondary winding 224 of gate drive isolation transformer 220. The source of electronically controlled switch SC is connected to a second end of secondary winding 224 of gate drive isolation transformer 220, a second end of primary winding 216 of transformer 210, and to the drain of primary electronically controlled switch SP. The source of primary electronically controlled switch SP is connected to a first common point, in one embodiment the first common point is associated with a primary side ground. The gate of primary electronically controlled switch SP is connected to a first end of secondary winding 222 of gate drive isolation transformer 220. A second end of secondary winding 222 of gate drive isolation transformer 220 is connected to the first common point. A first end of primary winding 223 of gate drive isolation transformer 220 is connected to a respective output of secondary side controller 250 and a second end of primary winding 223 of gate drive isolation transformer 220 is connected to a second common point, in one embodiment the second common point is associated with a secondary side ground. Secondary winding 224 of gate drive isolation transformer 220 is arranged such that the polarity of the winding terminal connected to the gate of electronically controlled switch SC opposes the polarity of the primary winding 223 terminal connected to secondary side controller 250. Secondary winding 222 is arranged such that the polarity of the winding terminal connected to the gate of primary electronically controlled switch SP is consonant with the polarity of the terminal of primary winding 223 connected to secondary side controller 250.

A first end of secondary winding 211 of transformer 210 is connected to the cathode of unidirectional electronic valve D1 and a second end of secondary winding 211 is connected to the second common point. Secondary winding 211 is arranged such that the polarity of the winding terminal connected to the second common point is consonant with the polarity of the terminal of primary winding 216 connected to the drain of primary electronically controlled switch SP. The anode of unidirectional electronic valve D1, representing a first output voltage appearing at first output lead 241, illustrated without limitation as −10V, is connected to terminal VSS of integrated four quadrant PMOSFET based switch 100 and to a first end of a first capacitor 70. A second end of first capacitor 70 is connected to the second common point. In a preferred embodiment the first output voltage is the most negative voltage provided by the secondary windings of transformer 210.

A first end of secondary winding 212 of transformer 210 is connected to the anode of unidirectional electronic valve D2 and a second end of secondary winding 212 is connected to the second common point. Secondary winding 212 is arranged such that the polarity of the winding terminal connected to the second common point opposes the polarity of the terminal of primary winding 216 connected to the drain of primary electronically controlled switch SP. The cathode of unidirectional electronic valve D2, representing a second output voltage appearing at output lead 242, illustrated without limitation as +10V, is connected to terminal VCC of each of first and second integrated four quadrant NMOSFET based switches 10 and to a first end of a second capacitor 70. A second end of second capacitor 70 is connected to the second common point. In a preferred embodiment the second output voltage is the most positive voltage provided by the secondary windings of transformer 210.

A first end of secondary winding 213 of transformer 210 is connected to a respective input of secondary side controller 250 and to a first end of a third capacitor 70, and represents a first secondary side controlled output voltage appearing at output lead 243, illustrated without limitation as −3.3V. A second end of third capacitor 70 is connected to the second common point. Secondary winding 213 is arranged such that the polarity of the winding terminal connected to the first secondary side controlled output voltage opposes the polarity of the terminal of primary winding 216 connected to the drain of primary electronically controlled switch SP. A second end of secondary winding 213 is connected to terminal D of integrated four quadrant PMOSFET based switch 100. Terminal S of integrated four quadrant PMOSFET based switch 100 is connected to the second common point. Terminal VCC of integrated four quadrant PMOSFET based switch 100 is connected to a first end of the associated capacitor 60 and a second end of the associated capacitor 60 is connected to the second common point. Terminal ON/$\overline{\text{OFF}}$ of integrated four quadrant PMOSFET based switch 100 is connected to a respective output of secondary side controller 250.

A first end of secondary winding 214 of transformer 210 is connected to a respective input of secondary side controller 250 and to a first end of a fourth capacitor 70, and represents a second secondary side controlled output voltage appearing at output lead 244, illustrated without limitation as +3.3V. A second end of fourth capacitor 70 is connected to the second common point. Secondary winding 214 is arranged such that the polarity of the winding terminal connected to the second secondary side controlled output voltage is consonant with the polarity of the terminal of primary winding 216 connected to the drain of primary electronically controlled switch SP. A second end of secondary winding 214 is connected to terminal D of first integrated four quadrant NMOSFET based switch 10A. Terminal S of first integrated four quadrant NMOSFET based switch 10A is connected to the second common point. Terminal VSS of first integrated four quadrant NMOSFET based switch 10A is connected to a first end of the associated capacitor 60 and a second end of the associated capacitor 60 is connected to the second common point. Terminal ON/$\overline{\text{OFF}}$ of first integrated four quadrant NMOSFET based switch 10A is connected to a respective output of secondary side controller 250.

A first end of secondary winding 215 of transformer 210 is connected to a respective input of secondary side controller 250 and to a first end of a fifth capacitor 70, and represents a third secondary side controlled output voltage appearing at output lead 245, illustrated without limitation as +1.2V. A second end of fifth capacitor 70 is connected to the second common point. Secondary winding 215 is arranged such that the polarity of the winding terminal connected to the third secondary side controlled output voltage is consonant with the polarity of the terminal of primary winding 216 connected to the drain of primary electronically controlled switch SP. A second end of secondary winding 215 is connected to terminal D of second integrated four quadrant NMOSFET based switch 10B. Terminal S of second integrated four quadrant NMOSFET based switch 10B is connected to the second common point. Terminal VSS of second integrated four quadrant NMOSFET based switch 10B is connected to a first end of the associated capacitor 60 and a second end of the associated capacitor 60 is connected to the second common point. Terminal ON/$\overline{\text{OFF}}$ of second integrated four quadrant NMOSFET based switch 10B is connected to a respective output of secondary side controller 250.

Fly back converter 200 has been described as comprising a single integrated four quadrant PMOSFET based switch 100 and two integrated four quadrant NMOSFET based switches 10, however this is not meant to be limiting in any way and any number of integrated four quadrant PMOSFET based switches 100 and integrated four quadrant NMOSFET based switches 10, with an associated secondary winding and associated capacitors 60, 70, may be provided without exceeding the scope. Secondary side controller 250 may be powered by any of an external power source and an internal power source without exceeding the scope.

Figure 3B:
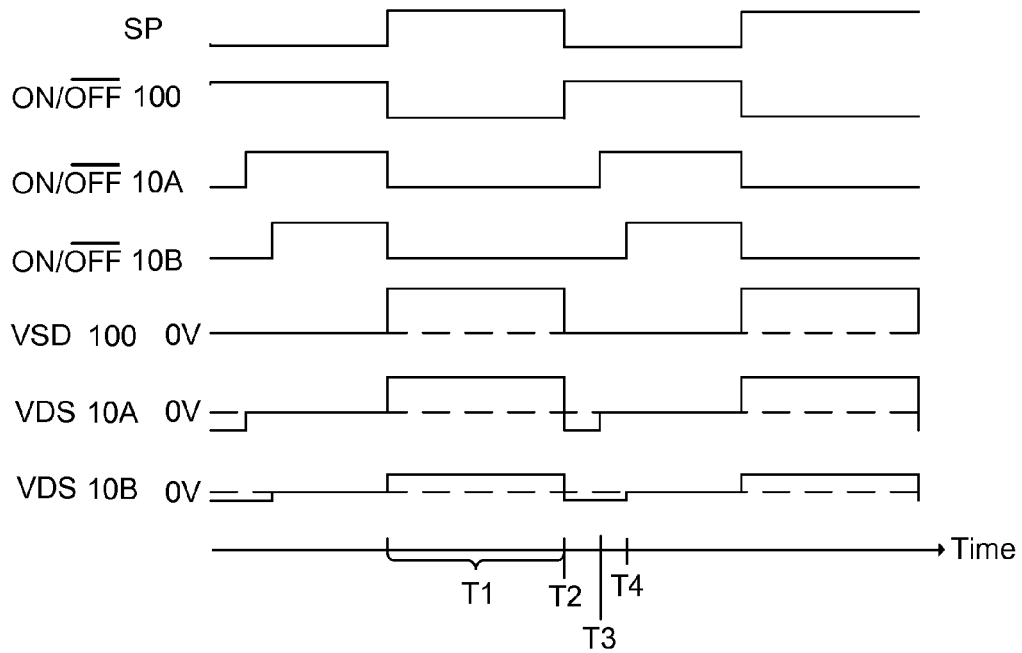
FIG. 3B illustrates a common timing diagram of certain signals and voltage levels of the embodiment of FIG. 3A.

FIG. 3B illustrates a common timing diagram of certain signals and voltage levels of flyback converter 200 in which the x-axis represents time and the y-axis represents voltage in arbitrary units. The voltage received at the gate of primary electronically controlled switch SP is illustrated as signal SP, the control signal received at the ON/OFF terminal of each integrated four quadrant MMOSFET based switch 10 is labeled ON/$\overline{\text{OFF}}$ 10A, ON/$\overline{\text{OFF}}$ 10B, respectively, and the control signal received at the gate of integrated four quadrant PMOSFET based switch 100 is labeled ON/$\overline{\text{OFF}}$ 100. The drain to source voltage of each integrated four quadrant NMOSFET based switch 10 is labeled VDS 10A, VDS 10B, respectively, and the source to drain voltage of integrated four quadrant PMOSFET based switch 100 is labeled VSD 100. For clarity, operation of flyback converter 200 of FIG. 3A will be described in relation to the common timing diagram signals of FIG. 3B.

In operation, secondary windings 211 and 212, with the associated respective unidirectional electronic valves D1, D2 develop supply rail voltages for each of the integrated four quadrant MOSFET based switches. Responsive to received secondary side controlled output voltages, secondary side controller 250 opens or closes primary electronically controlled switch SP, via gate drive isolation transformer 220, thereby controlling the duty rate of primary winding 216 of transformer 210. The outputs of secondary side controller 250 are arranged such that when primary electronically controlled switch SP is closed, integrated four quadrant PMOSFET based switch 100 and NMOSFET based switches 10 are open, as indicated by signals ON/$\overline{\text{OFF}}$ 10A, ON/$\overline{\text{OFF}}$ 10B and ON/$\overline{\text{OFF}}$ 100. Electronically controlled switch SC opens when electronically controlled switch SP closes and closes when primary electronically controlled switch SP opens, because of the reversed polarities of the winding terminal of secondary winding 222 of gate drive isolation transformer 220 connected to the gate of primary electronically controlled switch SP and the winding terminal of secondary winding 224 of gate drive isolation transformer 220 connected to the gate of electronically controlled switch SC.

When primary electronically controlled switch SP is closed, as depicted over time interval T1 of FIG. 3B, the polarity of the voltage across each of secondary windings 211 and 212 is determined by the polarity of the respective winding terminal connected to the associated one of unidirectional valves D1 and D2 in relation to the polarity of the winding terminal of primary winding 216 connected to primary electronically controlled switch SP, with the potential determined by the relative turns ratios which are selected to provide a voltage whose peak value is in excess of the desired voltage at the associated output lead. The polarity of the voltage across each of secondary windings 213, 214 and 215 is determined by the polarity of the respective winding terminal connected to the associated output lead in relation to the polarity of the winding terminal of primary winding 216 connected to primary electronically controlled switch SP, with the potential determined by the relative turns ratios which are selected to provide a voltage whose peak value is in excess of the desired voltage at the associated output lead. In particular, as described above, when primary electronically controlled switch SP is closed, integrated four quadrant PMOSFET based switch 100 and NMOSFET based switches 10 are open. The end of each secondary winding 213, 214, 215 connected to terminal D of the respective integrated four quadrant PMOSFET based switch 100 or NMOSFET based switches 10 is allowed to float while the other end of the secondary winding 213, 214, 215 is connected to the respective output capacitor 70 and is held at the potential of the output voltage associated with the respective output lead 243, 244, 245. The floating end of secondary winding 213 connected to terminal D of integrated four quadrant PMOSFET based switch 100, exhibits a negative potential in relation to output lead 243, the floating end of secondary winding 214 connected to terminal D of integrated four quadrant NMOSFET based switch 10A, exhibits a positive potential in relation to output lead 244 and the floating end of secondary winding 215 connected to terminal D of integrated four quadrant NMOSFET based switch 10B exhibits a positive potential in relation to output lead 245. Terminal D of integrated four quadrant PMOSFET based switch 100 is at a lower potential than the potential at terminal S of integrated four quadrant PMOSFET based switch 100, i.e. $V_{SD}$>0, and terminal D of each of first and second integrated four quadrant NMOSFET based switch 10 are at a greater potential than the potential at terminal S of the respective integrated four quadrant NMOSFET based switch 10, i.e. $V_{DS}$>0.

Each of terminals ON/OFF 10A, ON/OFF 10B and ON/OFF 100 are set to inactive. As described above in relation to FIGS. 1 and 2, when terminal ON/OFF is set to a value indicative of the desire to turn off integrated four quadrant NMOSFET based switch 10 and PMOSFET based switch 100, the gate and the body terminal connections of NMOSFET 20 are driven to the voltage at terminal VSS, thereby preventing any current flow when NMOSFET 20 is reverse biased and the gate and the body terminal connections of PMOSFET 120 are driven to the voltage at terminal VCC, thereby preventing any current flow when PMOSFET 120 is reverse biased. Thus, no current flows through the respective integrated four quadrant MOSFET based switch.

When primary electronically controlled switch SP opens, as depicted at time point T2 of FIG. 3B, electronically controlled switch SC closes, as described above, thereby enabling active clamp 230. The voltage across the primary winding of transformer 210 is clamped across capacitor 235 with the polarity of the voltage across primary winding 216 reversed. The end of secondary winding 213 connected to output lead 243 thus exhibits a negative potential in relation to the end of secondary winding 213 connected to terminal D of integrated four quadrant PMOSFET based switch 100, the end of secondary winding 214 connected to output lead 244 exhibits a positive potential in relation to the end of secondary winding 214 connected to terminal D of integrated four quadrant NMOSFET based switch 10A, and the end of secondary winding 215 connected to output lead 245 exhibits a positive potential in relation to the end of secondary winding 215 connected to terminal D of integrated four quadrant NMOSFET based switch 10B. The voltage across secondary windings 213, 214, 215 is approximately the voltage developed across active clamp 230 divided by the turns ratio. In reality, the voltage developed across active clamp 230 is not regulated, and reflects the turns ratio of transformer 210 times the output voltages over the long term.

When each of integrated four quadrant NMOSFET based switches 10A and 10B and integrated four quadrant PMOSFET based switch 100 is closed, the voltage from the respective terminal D to the respective terminal S is assumed to be zero volts. The above is shown at time point T2, where integrated four quadrant PMOSFET based switch 100, whose ON/OFF terminal changes coincidentally and opposing the activity of electronically controlled switch SP, is closed. Thus, voltage VSD 100 falls to zero responsive to the active rise of ON/OFF 100.

In the event that one of the integrated four quadrant NMOSFET based switches 10 remains open after electronically controlled switch SP opens, a small drain to source reverse bias voltage is developed, since the secondary voltage is larger than the respective output voltage, as described above. In particular, as described above, the terminal of secondary winding 214 connected to output lead 244, is held at the output voltage by capacitor 70, and thus, terminal D of integrated four quadrant NMOSFET based switch 10A is at a lower potential than the ground potential of terminal S of integrated four quadrant NMOSFET based switch 10A, as shown at time point T2. Advantageously, since ON/OFF 10A is inactive, and as described above in relation to FIG. 1 reverse bias current flow is limited, no appreciable reverse bias current occurs. Similarly, the terminal of secondary winding 215 connected to output lead 245, is held at the output voltage by capacitor 70, and thus, terminal D of integrated four quadrant NMOSFET based switch 10B is at a lower potential than the ground potential of terminal S of integrated four quadrant NMOSFET based switch 10B, as shown at time point T2. Advantageously, since ON/OFF 10B is inactive, and as described above in relation to FIG. 1 reverse bias current flow is limited, no appreciable reverse bias current occurs.

When integrated four quadrant based NMOSFET based switch 10A is closed, as illustrated at time point T3, the voltage from terminal D to terminal S of NMOSFET based switch 10A effectively falls to zero. When integrated four quadrant based NMOSFET based switch 10B is closed, as illustrated at time point T4, the voltage from terminal D to terminal S of NMOSFET based switch 10B effectively falls to zero.

Figure 4B:
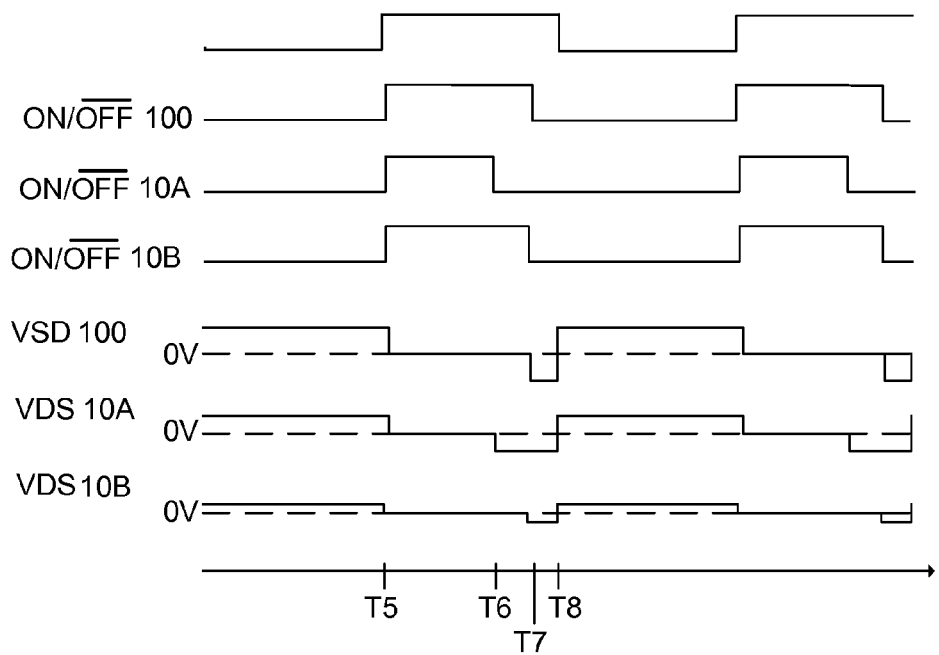
FIG. 4B illustrates a common timing diagram of certain signals and voltage levels of the embodiment of FIG. 4A.
Figure 4A:
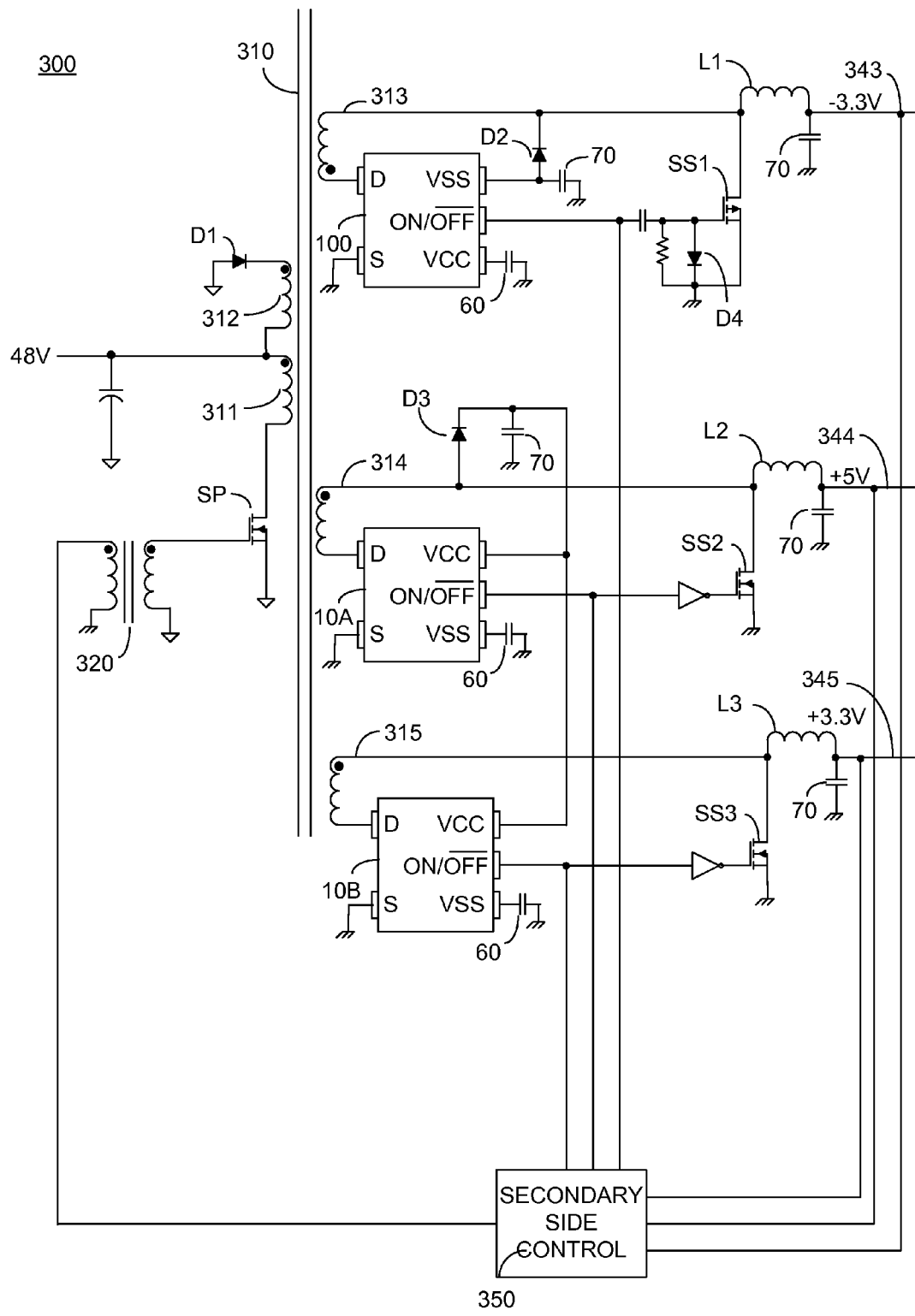
FIG. 4A illustrates a high level schematic diagram of an embodiment of a secondary side regulated forward converter implemented with embodiments of the integrated four quadrant MOSFET based switches of FIGS. 1 and 2.

FIG. 4A illustrates a high level schematic diagram of an embodiment of a secondary side regulated forward converter 300 implemented with embodiments of integrated four quadrant MOSFET based switches 10, 100 of FIGS. 1 and 2. Forward converter 300 comprises: a first and a second integrated four quadrant NMOSFET based switch 10, labeled respectively integrated four quadrant NSMOSFET based switch 10A and 10B, and collectively denoted integrated four quadrant NMOSFET based switch 10, each with an associated capacitor 60, an integrated four quadrant PMOSFET based switch 100, with an associated capacitor 60, each integrated four quadrant MOSFET based switch exhibiting the terminals described above in relation to FIGS. 1 and 2; a transformer 310 exhibiting a primary winding 311, a reset winding 312, and a plurality of secondary windings 313, 314 and 315 magnetically coupled to primary windings 311 and 312; a plurality of capacitors 70; a plurality of output leads denoted respectively output lead 343, 344 and 345; a plurality of unidirectional electronic valves denoted respectively D1, D2, D3 and D4; a plurality of secondary side electronically controlled switches denoted respectively SS1, SS2 and SS3, illustrated without limitation as MOSFETs; a plurality of inductors denoted respectively L1, L2 and L3; a gate drive isolation transformer 320; a primary electronically controlled switch SP; and a secondary side controller 350.

A first end of primary winding 311 of transformer 310 is connected to a power source, illustrated without limitation as +48V DC provided across an input capacitor, and to a first end of reset winding 312. The second end of reset winding 312 is connected to the cathode of unidirectional valve D1, and the anode of unidirectional valve D1 is connected to a first common point, illustrated as a primary side ground. The polarity of the terminal of reset winding 312 connected to the cathode of unidirectional valve D1 is consonant with the polarity of the terminal of primary winding 311 connected to the power source. The second end of primary winding 311 is connected to the drain of primary electronically controlled switch SP, illustrated as an NFET, and the source of primary electronically controlled switch SP is connected to the first common point. A first end of the secondary winding of gate drive isolation transformer 320 is connected to the gate of primary electronically controlled switch SP, and the second end of the secondary winding of gate drive isolation transformer 320 is connected to the first common point. A first end of the primary winding of gate drive isolation transformer 320 is connected to an output of secondary side controller 350, and a second end of the primary winding of gate drive isolation transformer 320 is connected to a second common point, illustrated as a secondary side ground. The polarity of the first end of the primary winding of gate drive isolation transformer 320 is consonant with the polarity of the first end of the secondary winding of gate drive isolation transformer 320.

A first end of secondary winding 313 of transformer 310 is connected to the cathode of unidirectional electronic valve D2, to a first end of inductor L1 and to the drain of secondary side electronically controlled switch SS1, illustrated without limitation as a PFET. The anode of unidirectional electronic valve D2 is connected to terminal VSS of integrated four quadrant PMOSFET based switch 100 and to a first end of a capacitor 70 whose second end is connected to the second common point. Secondary winding 313 is arranged such that the polarity of the winding terminal connected to the first end of inductor L1 is consonant with the polarity of the terminal of primary winding 311 connected to the drain of primary electronically controlled switch SP. The second end of inductor L1 is denoted output lead 343, illustrated without limitation as −3.3 V, and is connected to a respective input of secondary side controller 350 and via a respective capacitor 70 to the second common point. A second end of secondary winding 313 is connected to terminal D of integrated four quadrant PMOSFET based switch 100. Terminal S of integrated four quadrant PMOSFET based switch 100 is connected to the second common point. Terminal VCC of integrated four quadrant PMOSFET based switch 100 is connected to a first end of the associated capacitor 60 and a second end of the associated capacitor 60 is connected to the second common point. Terminal ON/$\overline{\text{OFF}}$ of integrated four quadrant PMOSFET based switch 100 is connected to a respective output of secondary side controller 350, and via a blocking capacitor to the gate of secondary side electronically controlled switch SS1. The source of secondary side electronically controlled switch SS1 is connected to the second common point, and the gate of secondary side electronically controlled switch SS1 is further connected to the second common point by a parallel combination of a resistor and unidirectional valve D4.

A first end of secondary winding 314 of transformer 310 is connected to the anode of unidirectional electronic valve D3, to a first end of inductor L2 and to the drain of secondary side electronically controlled switch SS2, illustrated without limitation as an NFET. The cathode of unidirectional electronic valve D3 is connected to terminal VCC of both integrated four quadrant NMOSFET based switches 10A and 10B, and via a respective capacitor 70 to the second common point. Secondary winding 313 is arranged such that the polarity of the winding terminal connected to the first end of inductor L2 opposes the polarity of the terminal of primary winding 311 connected to the drain of primary electronically controlled switch SP. The second end of inductor L2 is denoted output lead 344, illustrated without limitation as +5 V, and is connected to a respective input of secondary side controller 350 and via a respective capacitor 70 to the second common point. A second end of secondary winding 314 is connected to terminal D of integrated four quadrant NMOSFET based switch 10A. Terminal S of integrated four quadrant NMOSFET based switch 10A is connected to the second common point and terminal VSS is connected via a respective capacitor 60 to the second common point. Terminal ON/$\overline{\text{OFF}}$ of integrated four quadrant NMOSFET based switch 10A is connected to a respective output of secondary side controller 350, and via an inverter to the gate of secondary side electronically controlled switch SS2. The source of secondary side electronically controlled switch SS2 is connected to the second common point.

A first end of secondary winding 315 of transformer 310 is connected to a first end of inductor L3 and to the drain of secondary side electronically controlled switch SS3, illustrated without limitation as an NFET. Secondary winding 315 is arranged such that the polarity of the winding terminal connected to the first end of inductor L3 opposes the polarity of the terminal of primary winding 311 connected to the drain of primary electronically controlled switch SP. The second end of inductor L3 is denoted output lead 345, illustrated without limitation as +3.3 V, and is connected to a respective input of secondary side controller 350 and via a respective capacitor 70 to the second common point. A second end of secondary winding 315 is connected to terminal D of integrated four quadrant NMOSFET based switch 10B. Terminal S of integrated four quadrant NMOSFET based switch 10B is connected to the second common point and terminal VSS is connected via a respective capacitor 60 to the second common point. Terminal ON/$\overline{\text{OFF}}$ of integrated four quadrant NMOSFET based switch 10B is connected to a respective output of secondary side controller 350, and via an inverter to the gate of secondary side electronically controlled switch SS3. The source of secondary side electronically controlled switch SS3 is connected to the second common point.

Forward converter 300 has been described as comprising a single integrated four quadrant PMOSFET based switch 100 and two integrated four quadrant NMOSFET based switches 10, however this is not meant to be limiting in any way and any number of integrated four quadrant PMOSFET based switches 100 and integrated four quadrant NMOSFET based switches 10, with associated secondary windings and associated inductors and secondary side switches may be provided without exceeding the scope. Secondary side controller 350 may be powered by any of an external power source and an internal power source without exceeding the scope.

FIG. 4B illustrates a common timing diagram of certain signals and voltage levels of forward converter 300 in which the x-axis represents time and the y-axis represents voltage in arbitrary units. The voltage received at the gate of primary electronically controlled switch SP is illustrated as signal SP, the control signal received at the ON/OFF terminal of each integrated four quadrant NMOSFET based switch 10 is labeled ON/$\overline{\text{OFF}}$ 10A, ON/$\overline{\text{OFF}}$ 10B, respectively, and the control signal received at the gate of integrated four quadrant PMOSFET based switch 100 is labeled ON/$\overline{\text{OFF}}$ 100. The drain to source voltage of each integrated four quadrant NMOSFET based switch 10 is labeled VDS 10A, VDS 10B, respectively, and the source to drain voltage of integrated four quadrant PMOSFET based switch 100 is labeled VSD 100. For clarity, operation of forward converter 300 of FIG. 4A will be described in relation to the common timing diagram signals of FIG. 4B.

In operation, primary side electronically controlled switch SP can be driven with up to a 50% duty cycle, since regulation is performed for each output on the secondary side. In another embodiment (not shown), one output is regulated by primary side control and the other outputs are regulated by secondary side controller 350. Primary side electronically controlled switch SP is driven by secondary side controller 350 via gate drive isolation transformer 320. Each of the secondary windings 313, 314 and 315 exhibit a voltage equal to the primary side voltage divided by the turns ratio. When primary electronically controlled switch SP is open, flux stored in primary winding 311 is discharged via reset winding 312 and unidirectional electronic valve D1. The core magnetization current that increases when electronically controlled switch SP is closed transfers to reset winding 312 when electronically controlled switch SP opens. The consistent direction of current flow causes the voltage polarity across reset winding 312 to reverse. The reversal of polarity causes the magnetization current to decrease, thereby allowing for reset of the core magnetization.

The outputs of secondary side controller 250 are arranged such that when primary electronically controlled switch SP is closed, integrated four quadrant PMOSFET based switch 100 and NMOSFET based switches 10 are closed for a portion of the time, as indicated by signals ON/OFF 10A, ON/OFF 10B and ON/OFF 100 and when primary electronically controlled switch SP is open, integrated four quadrant PMOSFET based switch 100 and NMOSFET based switches 10 are open as indicated by signals ON/OFF 10A, ON/OFF 10B and ON/OFF 100.

When primary electronically controlled switch SP is closed, as depicted beginning at time point T5 of FIG. 4B, the polarity of the voltage across each of secondary windings 313, 314, and 315 is determined by the polarity of the terminal of the respective winding connected to the associated inductor in relation to the polarity of the terminal of primary winding 316 connected to the drain of primary electronically controlled switch SP, with the potential determined by the relative turns ratios, which are selected to provide a voltage whose peak value is in excess of the desired voltage at the associated output lead. In particular, when primary electronically controlled switch SP is closed, the end of secondary winding 313 connected to inductor L1 and associated with output lead 343 exhibits a negative potential in relation to terminal D of integrated four quadrant PMOSFET based switch 100; the end of secondary winding 314 connected to inductor L2 and associated with output lead 344 exhibits a positive potential in relation to terminal D of integrated four quadrant NMOSFET based switch 10A; and the end of secondary winding 315 connected to inductor L3 and associated with output lead 345 exhibits a positive potential in relation to terminal D of integrated four quadrant NMOSFET based switch 10B.

When terminals ON/OFF 100, 10A and 10B are set to a value indicative of the desire to turn on integrated four quadrant PMOSFET based switch 100 and NMOSFET based switches 10, the associated secondary side switches SS1, SS2 and SS3 are open, and the drain to source voltage of each of integrated four quadrant PMOSFET based switch 100 and NMOSFET based switches 10A and 10B is effectively zero, as shown at time point T5. Secondary side switch SS1 is capacitively coupled to terminal ON/OFF of integrated four quadrant PMOSFET based switch 100 so as to enable turn on of PFET secondary side switch SS1, which requires a gate voltage lower than ground. Unidirectional electronic valve D4 functions, in the absence of a drive signal, to set the gate voltage of secondary side switch SS1 to be a diode drop above ground, and the coupling capacitor exhibits a voltage impressed across it. The resistor parallel to unidirectional electronic valve D4 functions to maintain the coupling capacitor voltage and to bleed off any positive voltage glitches on the gate.

At time point T6, responsive to secondary side controller 350, terminal ON/OFF of integrated four quadrant NMOSFET based switch 10A becomes inactive, which further functions to turn on secondary side switch SS2, which drives the drain of secondary side switch SS2 to the potential of the second common point. Since, as indicated above, when primary electronically controlled switch SP is closed the potential at the drain of secondary side switch SS2 is greater than the potential at terminal D of integrated four quadrant NMOSFET based switch 10A, voltage VDS 10A becomes negative. As described above in relation to FIG. 1, when terminal ON/OFF is set to a value indicative of the desire to turn off integrated four quadrant NMOSFET based switch 10A, the gate and the body terminal connections of NMOSFET 20 are driven to the voltage at terminal VSS, thereby preventing any current flow when NMOSFET 20 is reverse biased. Thus, no appreciable current flows, even though the potential of terminal D of integrated four quadrant NMOSFET based switch 10A is less than the potential of terminal S of integrated four quadrant NMOSFET based switch 10A.

At time point T7, responsive to secondary side controller 350, terminal ON/OFF of integrated four quadrant NMOSFET based switch 10B becomes inactive as does integrated four quadrant PMOSFET based switch 100, which further functions to turn on secondary side switches SS1 and SS3, which drives the drain of each of secondary side switch SS1 and SS3 to the potential of the second common point.

As indicated above, since when primary electronically controlled switch SP is closed the potential at the drain of secondary side switch SS3 is greater than the potential at terminal D of integrated four quadrant NMOSFET based switch 10B, voltage VDS 10AB becomes negative. As described above in relation to FIG. 1, when terminal ON/OFF is set to a value indicative of the desire to turn off integrated four quadrant NMOSFET based switch 10B, the gate and the body terminal connections of NMOSFET 20 are driven to the voltage at terminal VSS, thereby preventing any current flow when NMOSFET 20 is reverse biased. Thus, no appreciable current flows, even though the potential of terminal D of integrated four quadrant NMOSFET based switch 10B is less than the potential of terminal S of integrated four quadrant NMOSFET based switch 10B.

Similarly, since when primary electronically controlled switch SP is closed the potential at the drain of secondary side switch SS1 is less than the potential at terminal D of integrated four quadrant PMOSFET based switch 100, voltage VSD 100 becomes negative. As described above in relation to FIG. 2, when terminal ON/OFF is set to a value indicative of the desire to turn off integrated four quadrant PMOSFET based switch 100, the gate and the body terminal connections of PMOSFET 120 are driven to the voltage at terminal VCC, thereby preventing any current flow when PMOSFET 120 is reverse biased. Thus, no appreciable current flows, even though the potential of terminal D of integrated four quadrant PMOSFET based switch 100 is greater than the potential of terminal S of integrated four quadrant PMOSFET based switch 100.

At time point T8, primary side electronically controlled switch SP is opened, integrated four quadrant PMOSFET based switch 100 and NMOSFET based switches 10 are open, and secondary side switches SS1, SS2 and SS3 are closed. The voltage across primary winding 311 is reversed, and therefore the voltage across each of the secondary windings 313, 314 and 315 are reversed. In particular, when electronically controlled switch SP is open, the end of secondary winding 313 connected to inductor L1 and associated with output lead 343 exhibits a positive potential in relation to terminal D of integrated four quadrant PMOSFET based switch 100, and is set to the potential of the second common point; the end of secondary winding 314 connected to inductor L2 and associated with output lead 344 exhibits a negative potential in relation to terminal D of integrated four quadrant NMOSFET based switch 10A, and is set to the potential of the second common point; and the end of secondary winding 315 connected to inductor L3 and associated with output lead 345 exhibits a negative potential in relation to terminal D of integrated four quadrant NMOSFET based switch 10B, and is set to the potential of the second common point. Thus, integrated four quadrant PMOSFET based switch 100 exhibits a positive VSD, and integrated four quadrant NMOSFET based switches 10A and 10B exhibit a positive VDS, thereby effectively blocking current flow there through.

Thus, certain embodiments enable an arrangement in which a pair of drivers are provided in cooperation with a MOSFET, and a limit voltage source is provided, the limit voltage source arranged to provide a voltage consonant with the most extreme voltage experienced by the drain of the MOSFET when the drain is reverse biased in relation to the source.

Each of the pair of drivers is coupled to a control signal. A first one of the drivers is arranged such that when current flow through the MOSFET is to be enabled responsive to a first condition of the control signal, the gate of the MOSFET is driven with an appropriate voltage, and when current flow through the MOSFET is to be disabled responsive to a second condition of the control signal, the gate is driven towards the limit voltage. A second one of the drivers is arranged such that when current flow through the MOSFET is to be enabled responsive to the first condition of the control signal, the body diode connection of the MOSFET is driven towards the potential of the MOSFET source, and when current flow through the MOSFET is to be disabled responsive to the second condition of the control signal, the body diode connection is driven towards the limit voltage.

Advantageously, the four quadrant MOSFET based switch is in one embodiment combined with a multiple output DC/DC converter whose design is simplified due to the reverse blocking feature. The multiple output DC/DC converter is in one further embodiment a flyback converter, and in another further embodiment a secondary side regulated forward converter.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

I claim:

1. An apparatus comprising:
    a metal oxide semiconductor field effect transistor (MOSFET);
    a first driver exhibiting an input responsive to a control signal and an output coupled to the gate of said MOSFET, said first driver arranged to apply a predetermined voltage to the gate of the MOSFET responsive to a first condition of the control signal, said predetermined voltage selected to enable current flow through the channel of the MOSFET, and to apply a limit voltage to the gate of the MOSFET responsive to a second condition of the control signal, said limit voltage consonant with the most extreme voltage experienced by the drain of said MOSFET when reverse biased in relation to the source of said MOSFET; and
    a second driver exhibiting an input responsive to the control signal and an output coupled to the body connection of the MOSFET, said second driver arranged to apply a potential consonant with the potential of the source of the MOSFET to the body connection of said MOSFET responsive to the first condition of the control signal, and to apply the limit voltage to the body connection of said MOSFET responsive to the second condition of the control signal,
    wherein said MOSFET, said first driver and said second driver constitute an electronically controlled switch.

2. An apparatus according to claim 1, wherein said limit voltage is derived from the drain of said MOSFET.

3. An apparatus according to claim 1, wherein said MOSFET is a p-channel MOSFET, and wherein said limit voltage is greater than or equal to a diode drop below the most positive voltage experienced by the drain of said p-channel MOSFET.

4. An apparatus according to claim 1, wherein said MOSFET is an n-channel MOSFET, and wherein said limit voltage is less than or equal to a diode drop above the most negative voltage experienced by the drain of said n-channel MOSFET.

5. An apparatus according to claim 1, comprising a plurality of said electronically controlled switches each having a unique control signal associated therewith, further comprising a transformer with a plurality of secondary windings, each of said secondary windings associated with a particular one of said electronically controlled switches.

6. An apparatus according to claim 5, further comprising a control circuit arranged to output each of said unique control signals to each of said plurality of electronically controlled switches, said control circuitry further connected to receive an indication of the voltage output associated with each of said plurality of electronically controlled switches.

7. An apparatus according to claim 6, wherein said control circuit is operative to set each of said unique control signals alternately to one of said first condition and said second condition responsive to said respective indication of voltage output, and wherein the drain to source voltage of the MOSFET of the electronically controlled switch may be reverse biased when said unique control signal is in said second condition, without appreciable current flow.

8. An apparatus according to claim 5, wherein said transformer is a flyback transformer.

9. An apparatus according to claim 5, wherein said transformer is a forward transformer.

10. A secondary side controller comprising:
  a control circuit;
  a transformer exhibiting a primary winding and a plurality of secondary windings magnetically coupled to said primary winding; and
  a plurality of electronically controlled switches, each associated with a particular one of said secondary windings and each coupled to a respective control signal output of said control circuit, each of said electronically controlled switches comprising:
    a metal oxide semiconductor field effect transistor (MOSFET);
    a first driver exhibiting an input responsive to said respective control signal of said control circuit and an output coupled to the gate of said MOSFET, said first driver arranged to apply a predetermined voltage to the gate of the MOSFET responsive to a first condition of the respective control signal, said predetermined voltage selected to enable current flow through the channel of the MOSFET, and to apply a limit voltage to the gate of the MOSFET responsive to a second condition of the respective control signal, said limit voltage consonant with the most extreme voltage experienced by the drain of said MOSFET when reverse biased in relation to the source of said MOSFET; and
    a second driver exhibiting an input responsive to the respective control signal and an output coupled to the body connection of the MOSFET, said second driver arranged to apply a potential consonant with the potential of the source of the MOSFET to the body connection of said MOSFET responsive to the first condition of the respective control signal, and to apply the limit voltage to the body connection of said MOSFET responsive to the second condition of the respective control signal,
  wherein said control circuitry is further connected to receive an indication of the voltage output associated with each of said plurality of electronically controlled switches, and is operative to set each of said respective control signals alternately to one of said first condition and said second condition responsive to said respective indication of voltage output, and wherein the drain to source voltage of the MOSFET of the electronically controlled switch may be reverse biased when said unique control signal is in said second condition, without appreciable current flow.

11. A secondary side controller according to claim 10, wherein said transformer is a flyback transformer.

12. A secondary side controller according to claim 10, wherein said transformer is a forward transformer.

13. A method of electronically controlling a flow of current comprising:
  providing a metal oxide semiconductor field effect transistor (MOSFET);
  alternately applying a predetermined voltage to the gate of said provided MOSFET responsive to a first condition of a control signal, said predetermined voltage thereby enabling current flow through the channel of the MOSFET, and applying a limit voltage to the gate of the MOSFET responsive to a second condition of the control signal, said limit voltage consonant with the most extreme voltage experienced by the drain of said MOSFET when reverse biased in relation to the source of said MOSFET; and
  applying a potential consonant with the potential of the source of the MOSFET to the body connection of said MOSFET responsive to the first condition of the control signal, and applying the limit voltage to the body connection of said MOSFET responsive to the second condition of the control signal.

14. A method according to claim 13, further comprising deriving said limit voltage from the drain of said MOSFET.

15. A method according to claim 13, wherein said provided MOSFET is a p-channel MOSFET, and wherein said limit voltage is greater than or equal to a diode drop below the most positive voltage experienced by the drain of said p-channel MOSFET.

16. A method according to claim 13, wherein said MOSFET is an n-channel MOSFET, and wherein said limit voltage is less than or equal to a diode drop above the most negative voltage experienced by the drain of said n-channel MOSFET.

17. A method according to claim 13, further comprising:
  receiving an indication of an output voltage associated with said provided MOSFET; and
  alternately setting said control signal to each of said first condition and said second condition responsive to said received indication of output voltage,
  wherein the drain to source voltage of the provided MOSFET may be reverse biased when said control signal is in said second condition, without appreciable current flow.

* * * * *